(12) United States Patent
Yamagami et al.

(10) Patent No.: US 7,749,845 B2
(45) Date of Patent: Jul. 6, 2010

(54) SEMICONDUCTOR DEVICE MANUFACTURING METHOD

(75) Inventors: Shigeharu Yamagami, Yokohama (JP);
Masakatsu Hoshi, Yokohama (JP);
Tetsuya Hayashi, Yokosuka (JP);
Hideaki Tanaka, Yokohama (JP);
Yoshio Shimoida, Yokosuka (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 155 days.

(21) Appl. No.: 11/988,944

(22) PCT Filed: Jun. 26, 2006

(86) PCT No.: PCT/JP2006/313164

§ 371 (c)(1),
(2), (4) Date: Jan. 17, 2008

(87) PCT Pub. No.: WO2007/010732

PCT Pub. Date: Jan. 25, 2007

(65) Prior Publication Data

US 2009/0233408 A1 Sep. 17, 2009

(30) Foreign Application Priority Data

Jul. 19, 2005 (JP) .............................. 2005-208798

(51) Int. Cl.
*H01L 21/336* (2006.01)

(52) U.S. Cl. .................. 438/270; 438/542; 438/265; 438/259; 438/257; 438/266; 257/E21.135; 257/E21.41

(58) Field of Classification Search .................. 438/270, 438/259, 542, 265, 257, 266; 257/E21.135, 257/E21.41
See application file for complete search history.

(56) References Cited

U.S. PATENT DOCUMENTS

| 5,998,287 | A | 12/1999 | Huang |
| 6,818,516 | B1 * | 11/2004 | Lo et al. ...................... 438/287 |
| 6,897,115 | B2 * | 5/2005 | Cho et al. .................... 438/259 |
| 7,282,739 | B2 | 10/2007 | Kaneko |
| 2004/0132251 | A1 | 7/2004 | Yoshino et al. |
| 2004/0217358 | A1 | 11/2004 | Kaneko |

FOREIGN PATENT DOCUMENTS

| EP | 0 550 021 A2 | 7/1993 |
| EP | 1 519 419 A2 | 3/2005 |
| JP | 2003-318398 A | 11/2003 |

* cited by examiner

*Primary Examiner*—Matthew Smith
*Assistant Examiner*—Wilner Jean Baptiste
(74) *Attorney, Agent, or Firm*—Foley & Lardner LLP

(57) ABSTRACT

A method of manufacturing a semiconductor device having a polycrystalline silicon layer (5) includes; a step of forming a mask layer (7) on the polycrystalline silicon layer (5); a step of forming a side wall (8) that is provided on a side face of the mask layer (7) and covers part of the polycrystalline silicon layer (6); a step of doping an impurity (52) into the polycrystalline silicon layer (5) by using at least one of the mask layer (7) and the side wall (8) as a mask; and a step of etching the polycrystalline silicon layer (5, 6) by using at least one of the mask layer (7) and the side wall (8) as a mask.

12 Claims, 14 Drawing Sheets

SEMICONDUCTOR DEVICE MANUFACTURING METHOD

TECHNICAL FIELD

The present invention relates to a method of manufacturing a semiconductor device having a polycrystalline silicon layer as a constituent element, and the like.

BACKGROUND ART

A conventional technology related to the present invention is described in Japanese Patent Unexamined Publication No. 2003-318398. According to this technology, an N-type polycrystalline silicon layer and an N$^+$-type polycrystalline silicon layer are formed adjacently to each other on a main surface of a semiconductor body composed of an N$^+$-type silicon carbide substrate with an N$^-$-type silicon carbide epitaxial region formed thereon. The epitaxial region forms heterojunctions with the N-type polycrystalline silicon layer and the N$^+$-type polycrystalline silicon layer. Moreover, a gate electrode is formed adjacently to the junction portion of the epitaxial region with the N$^+$-type polycrystalline silicon layer, with a gate insulating film provided therebetween. The N-type polycrystalline silicon layer is connected to a source electrode, and a drain electrode is formed on the back face of the N$^+$-type silicon carbide substrate.

In a conventional method of manufacturing such a semiconductor device, a resist mask is formed on a polycrystalline silicon layer, and an impurity dopant is doped into an opening portion. Thereafter, the resist mask is removed once, and another resist mask having an opening provided with an inward offset with respect to the impurity-doped region is formed again. Then, etching is performed.

DISCLOSURE OF INVENTION

However, according to the conventional method of manufacturing a semiconductor device, the width (thickness) of the impurity-doped polycrystalline silicon layer is determined depending on the alignment precision in the photolithography for forming the resist mask to be used in etching. Therefore, it has been impossible to controllably form an impurity-doped polycrystalline silicon layer with a sufficiently narrow width. For this reason, it has been difficult to achieve devices having good leak current characteristics and a small range of variation.

The present invention has been made to solve such conventional problems, and an object of the present invention is to provide a semiconductor device manufacturing method that can controllably form an impurity-doped polycrystalline silicon layer with a sufficiently narrow width, as well as a hetero semiconductor region with a sufficiently narrow width.

The first aspect of the present invention provides a method of manufacturing a semiconductor device having a polycrystalline silicon layer, comprising: forming a mask layer on the polycrystalline silicon layer; forming a side wall that is provided on a side face of the mask layer and covers part of the polycrystalline silicon layer; doping an impurity into the polycrystalline silicon layer by using at least one of the mask layer and the side wall as a mask; and etching the polycrystalline silicon layer by using at least one of the mask layer and the side wall as a mask.

The second aspect of the present invention provides a method of manufacturing a semiconductor device which includes: a semiconductor body; a first hetero semiconductor region that is formed of a semiconductor material having a band-gap width different from that of the semiconductor body and has a first conductivity type; a second hetero semiconductor region that is formed in a predetermined area of a surface of the semiconductor body, is formed of a semiconductor material having a band-gap width different from that of the semiconductor body, and has a second conductivity type; a gate electrode that is arranged to be adjacent, via a gate insulating film, to at least a second heterojunction interface, among a first heterojunction interface that is an interface between the semiconductor body and the first hetero semiconductor region, and the second heterojunction interface that is an interface between the semiconductor body and the second hetero semiconductor region; a source electrode connected to the first and second hetero semiconductor regions; and a drain electrode connected to the semiconductor body, the method comprising: forming the first hetero semiconductor region doped with an impurity of the first conductivity type on the surface of the semiconductor body; forming a mask layer on the first hetero semiconductor region; and forming a side wall that is provided on a side face of the mask layer and covers part of the second hetero semiconductor region.

BEST MODE FOR CARRYING OUT THE INVENTION

Figure 1:
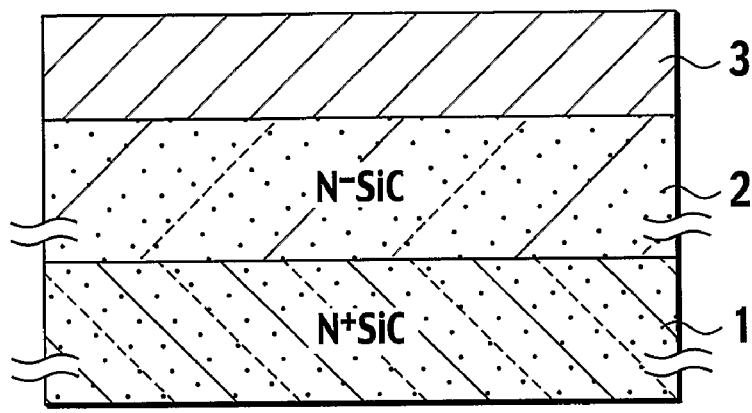
FIGS. 1 to 15 are cross-sectional views of a device to describe a first embodiment according to the present invention.

Embodiments of the present invention will be explained below with reference to the drawings, wherein like numbers are designated by like reference characters.

First Embodiment

A first embodiment of the present invention will be described based on the cross-sectional views of FIGS. 1 to 15 showing manufacturing process steps.

First, referring to FIG. 1, an N$^-$-type silicon carbide epitaxial layer 2 with an impurity concentration of $10^{14}$ to $10^{18}$ cm$^{-3}$ and a thickness of 1 to 100 μm is formed on an N$^+$-type silicon carbide substrate 1. Further, a polycrystalline silicon layer 3 having a band-gap width different from that of silicon carbide is formed on the N$^-$-type silicon carbide epitaxial layer 2.

Figure 2:
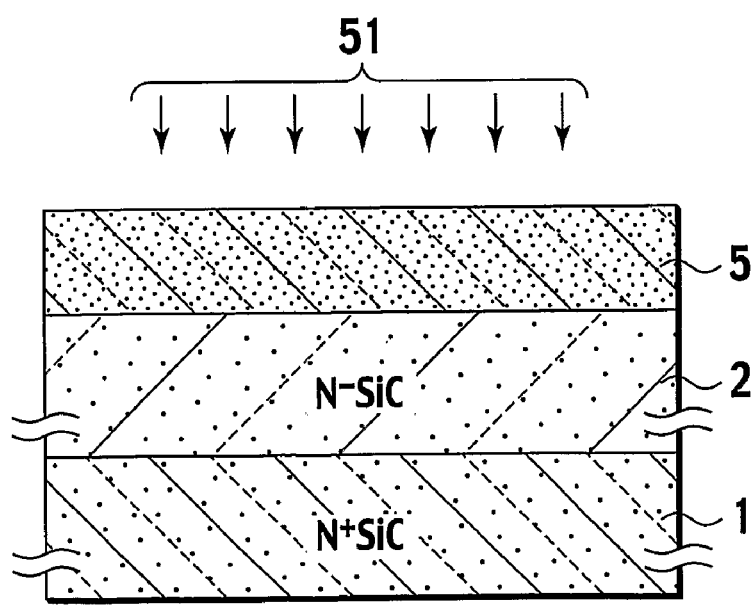

Next, referring to FIG. 2, a P-type impurity 51 (impurity of a first conductivity type) is doped into the polycrystalline silicon layer 3 by ion implantation, whereby a P-type polycrystalline silicon layer 5 (first hetero semiconductor region having the first conductivity type) is formed. For the P-type impurity 51, for example, boron is used. In this case, the interface between the N$^-$-type silicon carbide epitaxial layer 2 and the P-type polycrystalline silicon layer 5 forms a first heterojunction interface.

Figure 3:
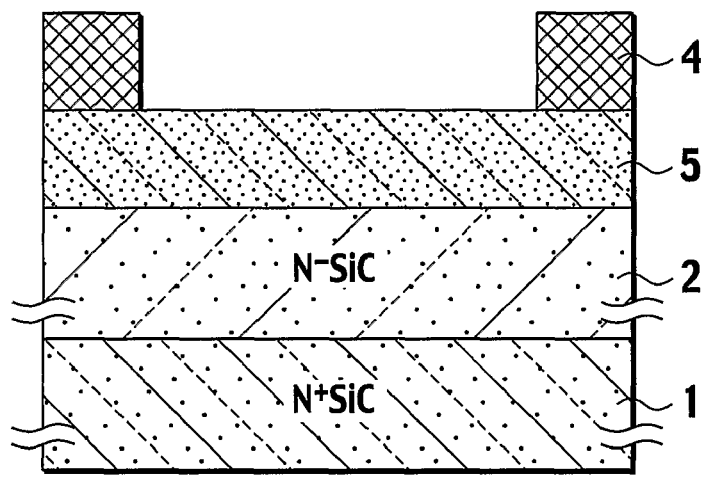

Next, referring to FIG. 3, a resist mask 4 is formed on the P-type polycrystalline silicon layer 5 by photolithography.

Figure 4:
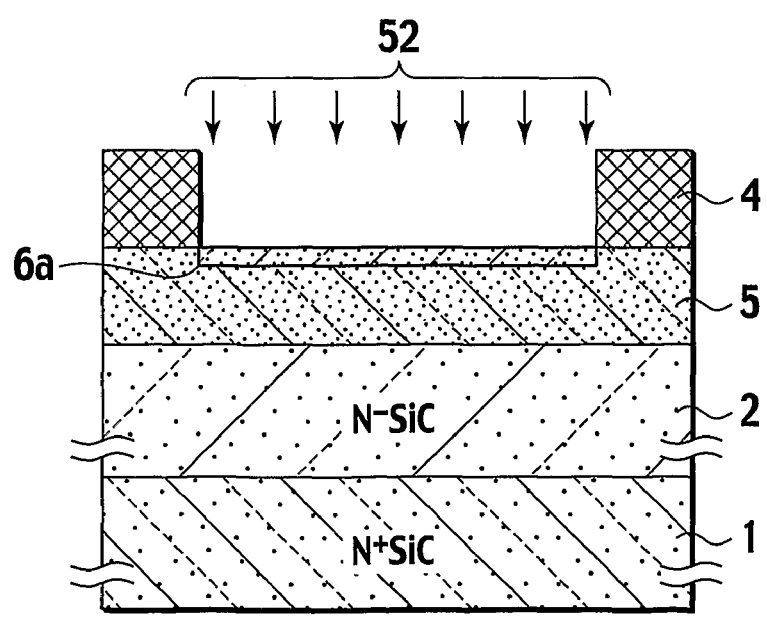

Next, referring to FIG. 4, using the resist mask 4 as a mask, an N-type impurity 52 (impurity of a second conductivity type) is doped into the P-type polycrystalline silicon layer 5 by ion implantation, whereby a shallow N-type polycrystalline silicon layer 6a is formed. For the N-type impurity 52, for example, arsenic or phosphorus is used.

Figure 5:
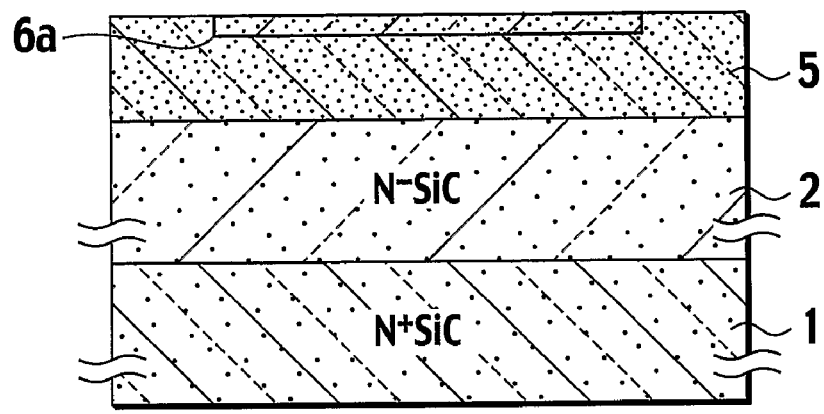

Next, referring to FIG. 5, the resist mask 4 is removed. Note that the process steps shown in FIGS. 3 to 5 are for forming the shallow N-type polycrystalline silicon layer 6a, and the shallow N-type polycrystalline silicon layer 6a is for connecting a later-formed N-type polycrystalline silicon layer to a source electrode.

Figure 6:
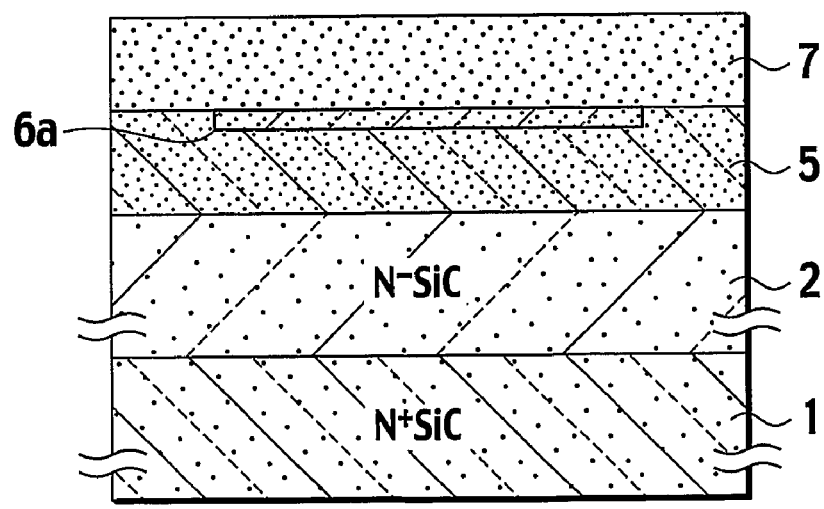

Next, referring to FIG. 6, a hard mask 7 (mask layer) is provided on the P-type polycrystalline silicon layer 5 and shallow N-type polycrystalline silicon layer 6a. For the hard mask 7, for example, $SiO_2$ or SiN is used.

Figure 7:
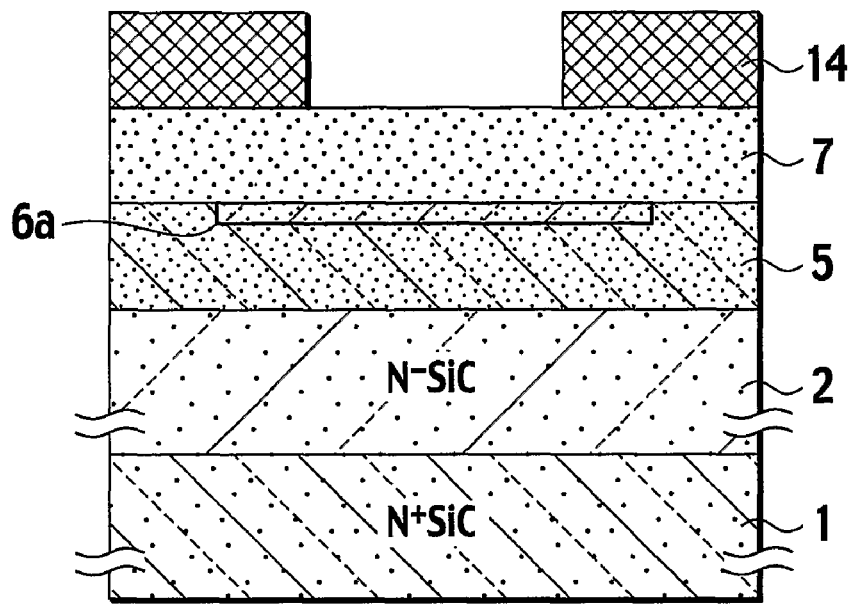

Next, referring to FIG. 7, a resist mask 14 for patterning of the hard mask 7 is formed on the hard mask 7 by photolithography.

Figure 8:
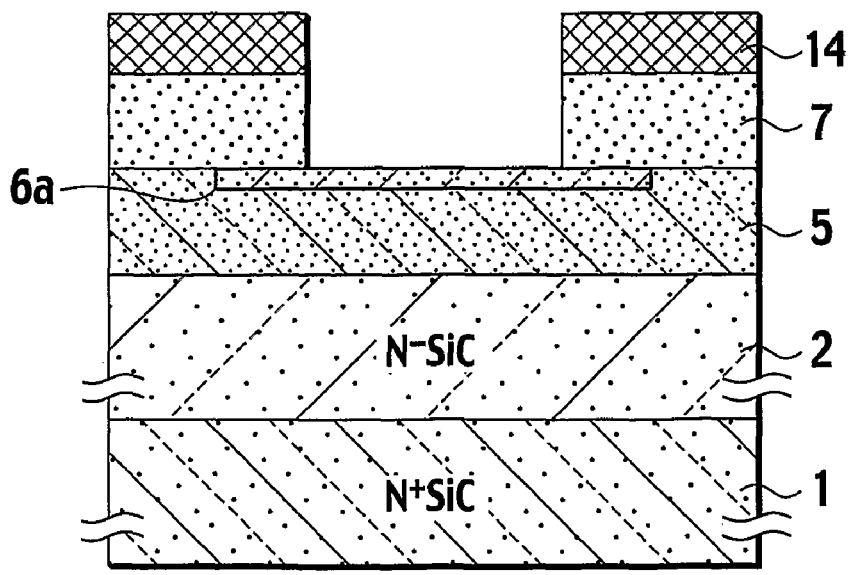

Next, referring to FIG. 8, using the resist mask 14 as a mask, the hard mask 7 is etched.

Figure 9:
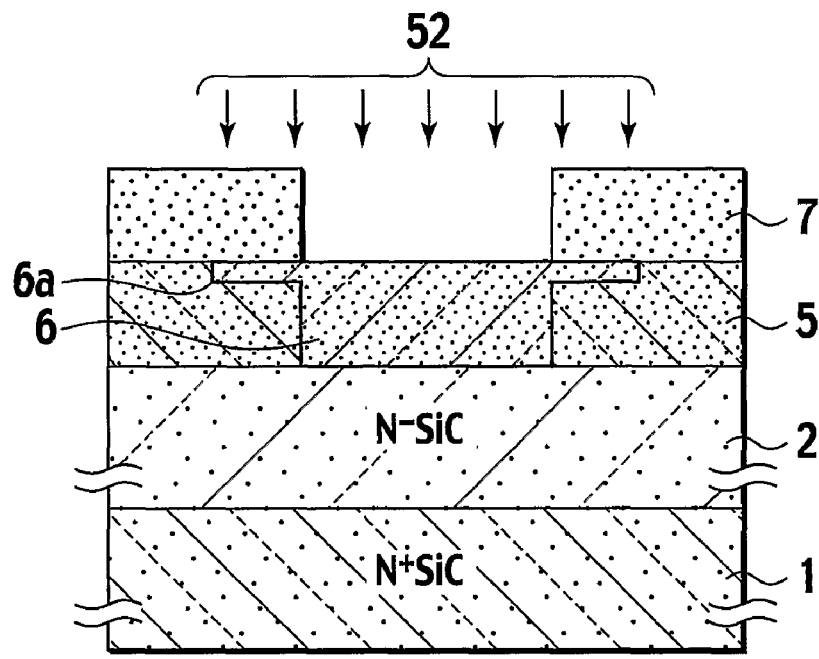

Next, referring to FIG. 9, the resist mask 14 is removed. Then, further using the hard mask 7 as a mask, the N-type impurity 52 is doped into the P-type polycrystalline silicon layer 5 by ion implantation, whereby an N-type polycrystalline silicon layer 6 (second hetero semiconductor region having the second conductivity type) is formed. In this case, the interface between the $N^-$-type silicon carbide epitaxial layer 2 and the N-type polycrystalline silicon layer 6 forms a second heterojunction interface.

Figure 10:
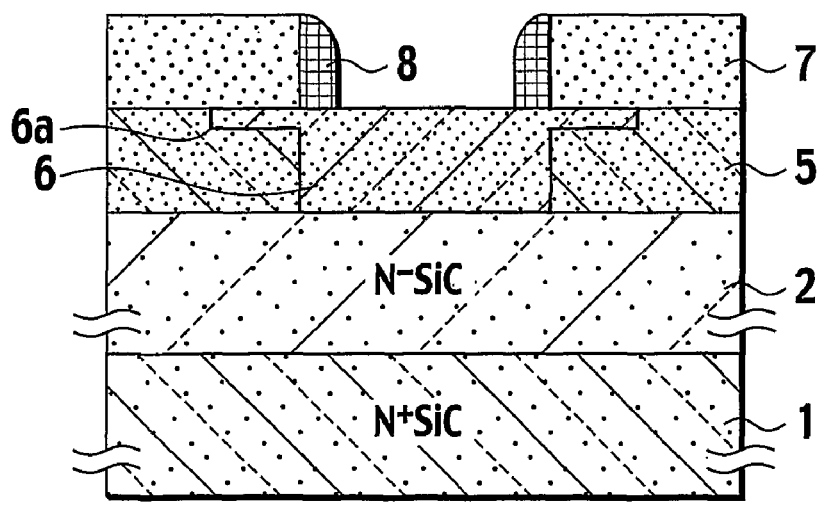

Next, referring to FIG. 10, a film, which is a material for a side wall 8, is isotropically deposited, and anisotropic etching is performed by using a reactive ion etching method (RIE method), whereby the side wall 8 is formed on a side face of the hard mask 7. For the material for the side wall 8, for example, $SiO_2$, SiN or the like is used.

Figure 11:
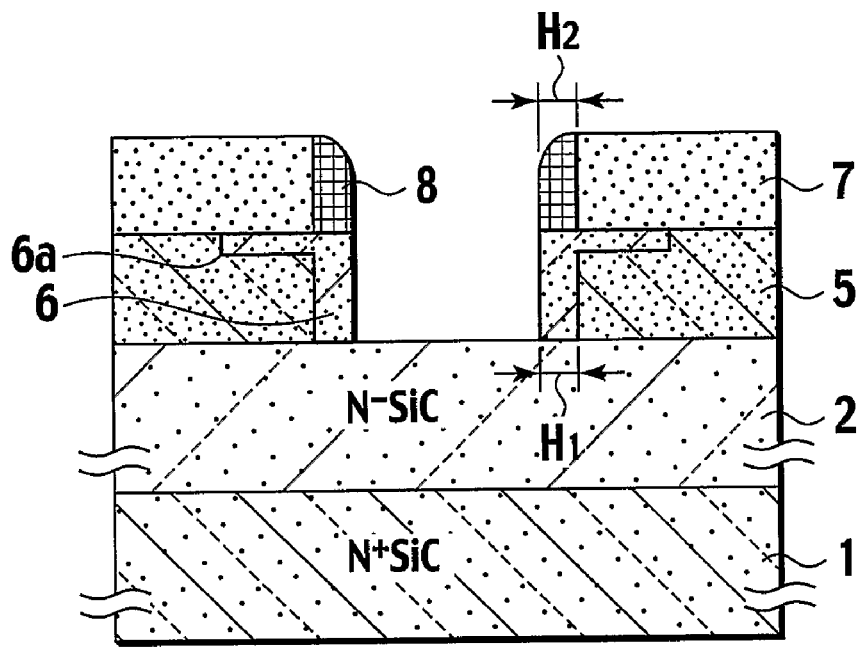

Next, referring to FIG. 11, using the hard mask 7 and side wall 8 as a mask, the N-type polycrystalline silicon layer 6 is etched.

Figure 12:
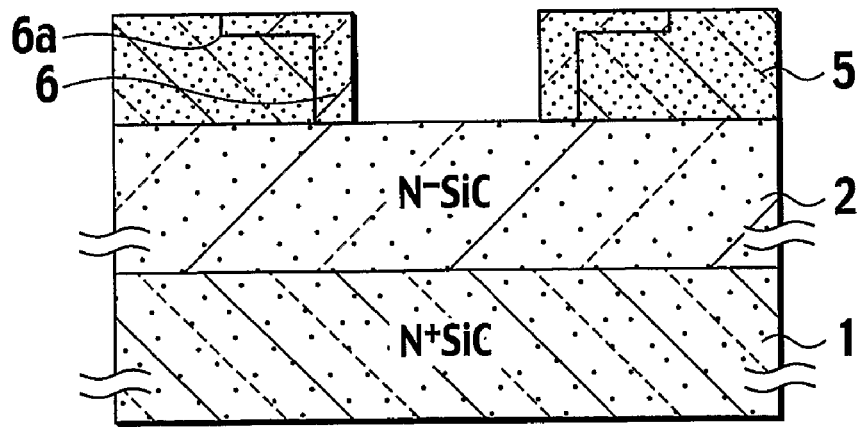

Next, referring to FIG. 12, the hard mask 7 and side wall 8 are removed by highly selective wet etching.

Figure 13:
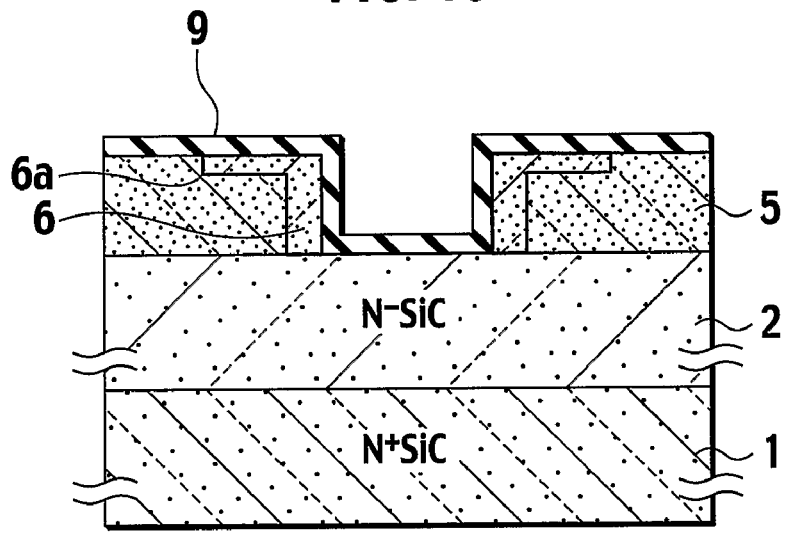
Figure 14:
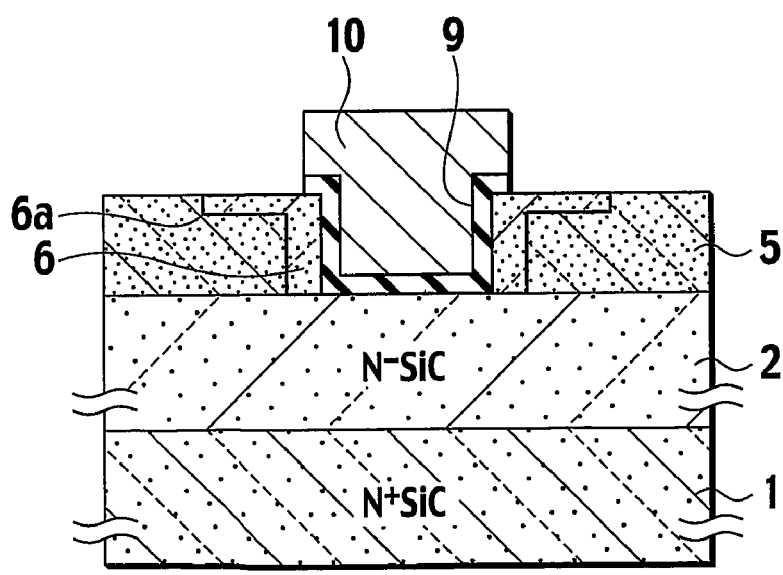

Next, referring to FIG. 13, a gate insulating film 9 is formed. Next, referring to FIG. 14, a gate electrode material is formed on the gate insulating film 9. Then, a resist pattern is formed by photolithography and transferred by dry etching. Thus formed is a gate electrode 10 that is arranged to be adjacent, via the gate insulating film 9, to at least the second heterojunction interface, among the first heterojunction interface and the second heterojunction interface. For the material for the gate electrode 10, for example, polycrystalline silicon or metal is used.

Figure 15:
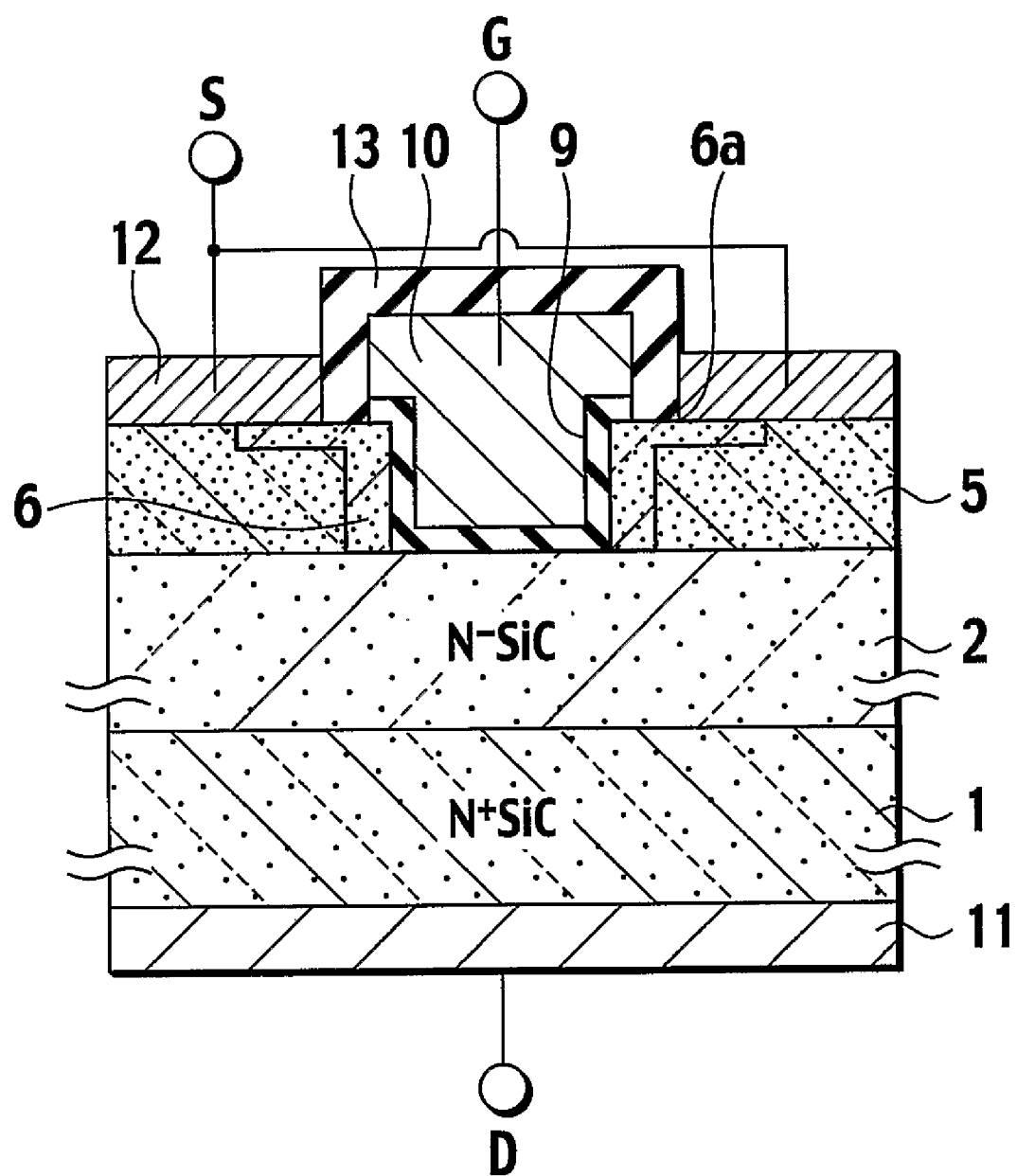

Next, referring to FIG. 15, first, an interlayer insulating film 13 is formed, and next, a contact hole is opened in the interlayer insulating film 13. Then, a source electrode 12 for ohmic contact is formed on the P-type polycrystalline silicon layer 5 and shallow N-type polycrystalline silicon layer 6. Further, a drain electrode 11 for ohmic contact is formed on the $N^+$-type silicon carbide substrate 1.

In the present embodiment, referring to FIG. 11, a width H1 of the N-type polycrystalline silicon layer 6, forming a heterojunction with the $N^-$-type silicon carbide epitaxial layer 2, becomes equal to a width H2 of the side wall 8. Therefore, the width H1 of the N-type polycrystalline silicon layer 6 can be controlled by controlling the width H2 of the side wall 8. In other words, the width H1 of the N-type polycrystalline silicon layer 6 can be defined in a self-aligning manner, independently of the alignment precision in photolithography. Accordingly, since the width H1 of the N-type polycrystalline silicon layer 6 can be sufficiently narrow, the leak current can be reduced. In addition, since the N-type polycrystalline silicon layer 6 can be controllably formed, the width H1 of the N-type polycrystalline silicon layer 6 can be prevented from varying from device to device, resulting in good characteristics with a small range of variation being achieved.

Furthermore, since the N-type polycrystalline silicon layer in the above-mentioned conventional technology is replaced with the P-type polycrystalline silicon layer 5, the breakdown voltage can be further increased. Specifically, in the case where an N-type polycrystalline silicon layer makes a junction with $N^-$-type silicon carbide, when positive voltage is applied to the $N^-$-type silicon carbide side, a small number of electrons in the N-type polycrystalline silicon layer tunnel through the energy barrier at the heterojunction interface. Further, energetically excited electrons in the N-type polycrystalline silicon layer overcome the energy barrier and flow into the $N^-$-type silicon carbide, resulting in a leak current. As described above, the electrons in the N-type polycrystalline silicon layer flow into the $N^-$-type silicon carbide and become a leak current. On the other hand, in the case where the P-type polycrystalline silicon layer 5 and the $N^-$-type silicon carbide epitaxial layer 2 make a junction, when positive voltage is applied to the $N^-$-type silicon carbide epitaxial layer 2, the number of electrons that tunnel through the energy barrier at the heterojunction interface is extremely small in comparison with the case where the N-type polycrystalline silicon layer is used, because few electrons, which serve as carriers, are present in the P-type polycrystalline silicon layer 5. In addition, for a similar reason, the number of electrons that overcome the energy barrier and flow into the N-type silicon carbide epitaxial layer 2 is extremely small. Accordingly, when the P-type polycrystalline silicon layer 5 is used, the leak current can be dramatically reduced in comparison with the case where the N-type polycrystalline silicon layer is used, and hence the breakdown voltage can be increased.

Incidentally, thermal treatment for activating the impurity in the N-type polycrystalline silicon layer 6 can be performed in any of the process steps shown in FIGS. 9 to 14. In the figures, description is given on the assumption that the diffusion of the impurity in the N-type polycrystalline silicon layer 6 caused by the activating thermal treatment is as small as negligible. However, if the N-type impurity is diffused into the P-type polycrystalline silicon layer 5, the width of the N-type polycrystalline silicon layer 6 that forms a heterojunction with the $N^-$type silicon carbide epitaxial layer 2 is the sum of the width of the side wall 8 and a width of the diffusion caused by heat.

Second Embodiment

A second embodiment of the present invention will be described based on the cross-sectional views of FIGS. 16 to 21 showing manufacturing process steps. The process steps shown in FIGS. 1 to 8 in the first embodiment are in common with the present embodiment.

Figure 16:
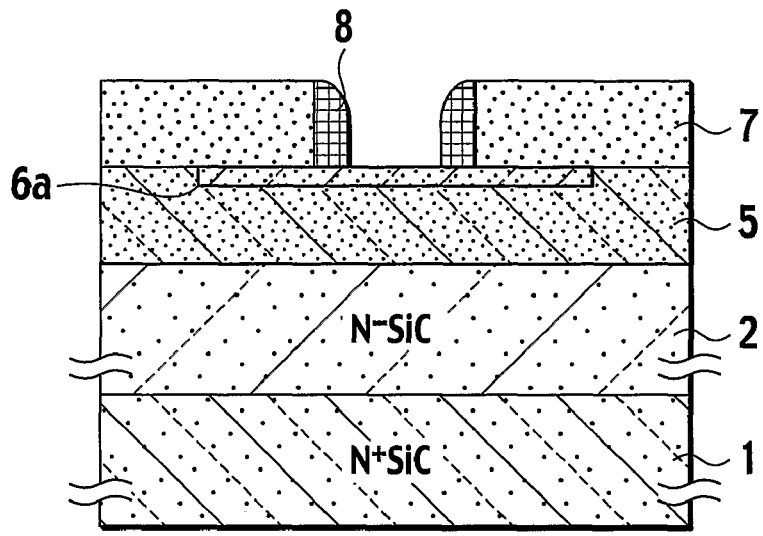
FIGS. 16 to 21 are cross-sectional views of a device to describe a second embodiment according to the present invention.

Referring to FIG. 16, after the step shown in FIG. 8, the resist mask 14 is removed. A film, which is a material for a side wall 8, is isotropically deposited, and anisotropic etching is performed by using a reactive ion etching method (RIE method), whereby the side wall 8 is formed on a side face of the hard mask 7. For the material for the side wall 8, for example, $SiO_2$, SiN or the like is used. However, in the present embodiment, the side wall 8 needs to be formed of a material different from that of the hard mask 7 because the side wall 8 is selectively etched in a subsequent process step.

Figure 17:
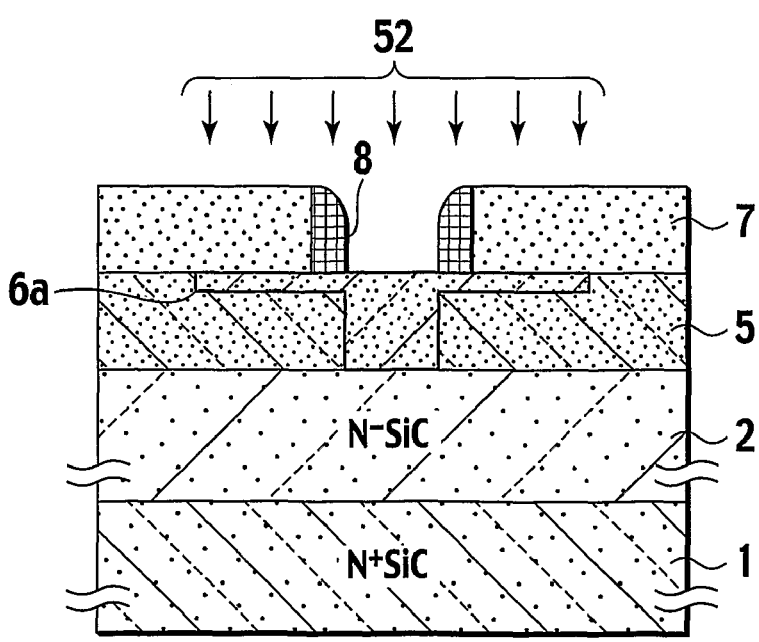

Next, referring to FIG. 17, using the hard mask 7 and side wall 8 as a mask, the N-type impurity 52 is doped.

Figure 18:
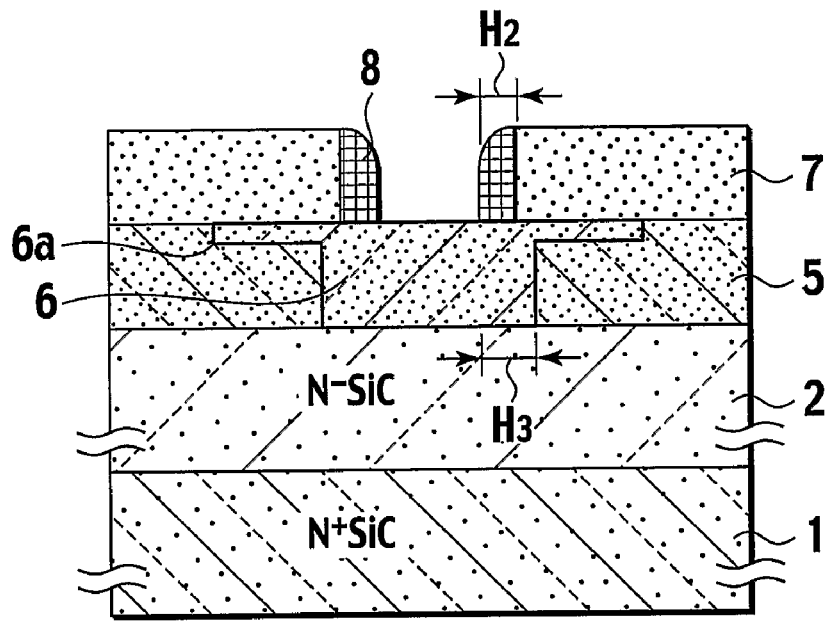

Next, referring to FIG. 18, thermal treatment is performed to activate the impurities in the polycrystalline silicon layers. In this event, depending on a method for the thermal treatment, the N-type impurity is widely diffused in the lateral direction as shown in FIG. 18.

Figure 19:
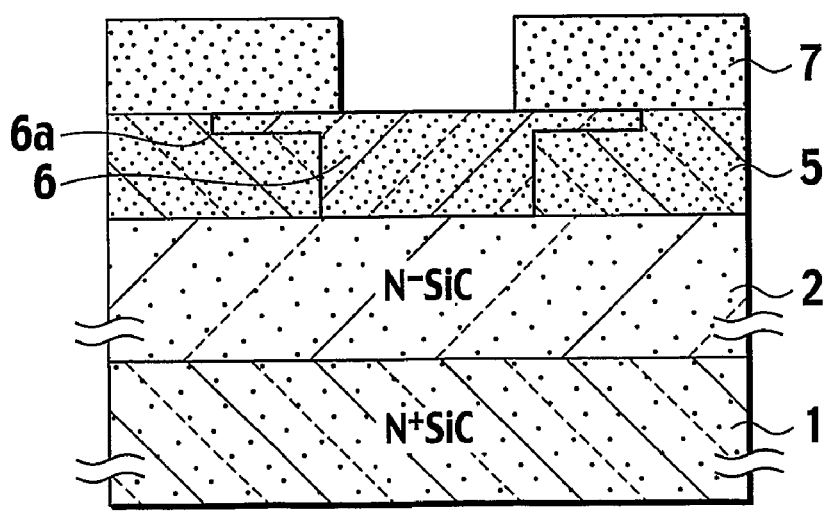

Next, referring to FIG. 19, the side wall 8 is removed by etching. In this event, since the side wall 8 and the hard mask 7 are formed of different materials, only the side wall 8 can be etched by highly selective wet etching.

Figure 20:
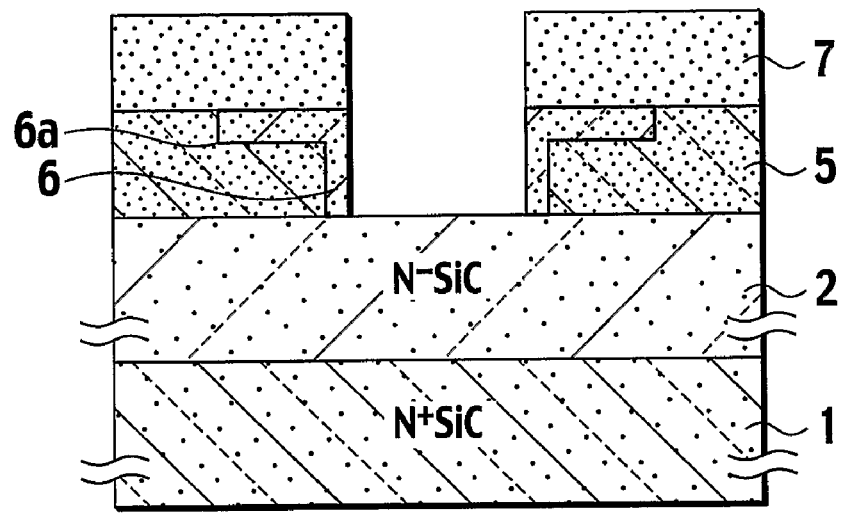

Next, referring to FIG. 20, using the hard mask 7 as a mask, the N-type polycrystalline silicon layer 6 is etched.

Figure 21:
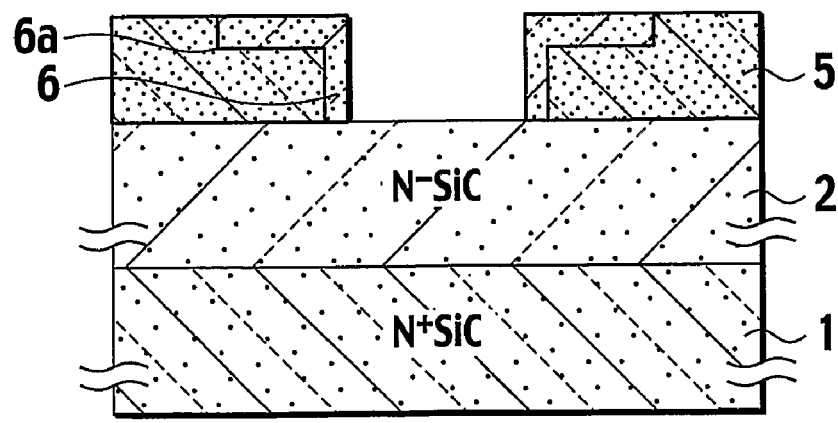

Next, referring to FIG. 21, the hard mask 7 is removed by etching. The subsequent process steps are similar to those shown in FIGS. 13 to 15 in the first embodiment.

According to the present embodiment, the width H1 of the ultimately formed N-type polycrystalline silicon layer 6 is what is given by subtracting the width H2 of the side wall 8 from a width H3 of the diffusion of the N-type impurity caused by thermal treatment in the step shown in FIG. 18. Accordingly, even if the N-type impurity in the N-type polycrystalline silicon layer 6 is diffused widely, the N-type polycrystalline silicon layer 6 with a desired width can be formed in a self-aligning manner by controlling the width H2 of the side wall 8.

Third Embodiment

A third embodiment of the present invention will be described based on the cross-sectional views of FIGS. 22 to 27 showing manufacturing process steps. The process steps shown in FIGS. 1 to 8 in the first embodiment are in common with the present embodiment.

Figure 22:
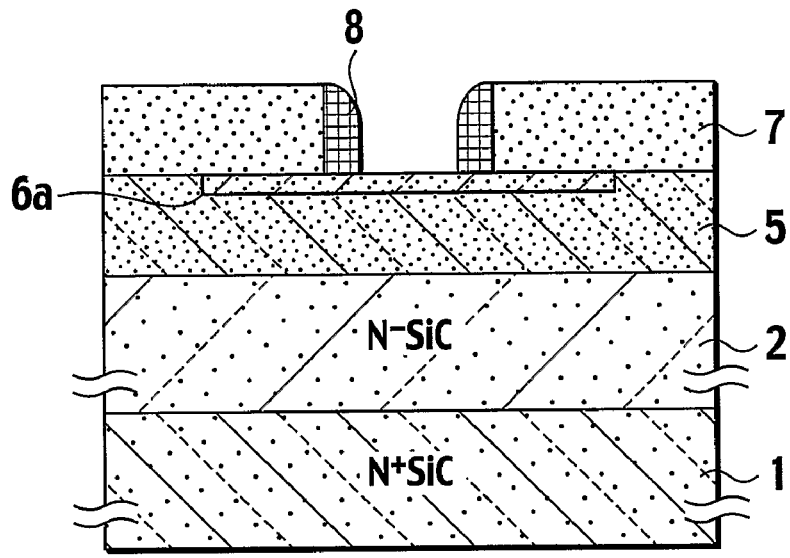
FIGS. 22 to 27 are cross-sectional views of a device to describe a third embodiment according to the present invention.

Referring to FIG. 22, after the step shown in FIG. 8, the resist mask 14 is removed. A film, which is a material for a side wall 8, is isotropically deposited, and anisotropic etching is performed by using a reactive ion etching method (RIE method), whereby the side wall 8 is formed on a side face of the hard mask 7. For the material for the side wall 8, for example, $SiO_2$, SiN or the like is used. However, in the present embodiment, the side wall 8 needs to be formed of a material different from that of the hard mask 7 because the side wall 8 is selectively etched in a subsequent process step.

Figure 23:
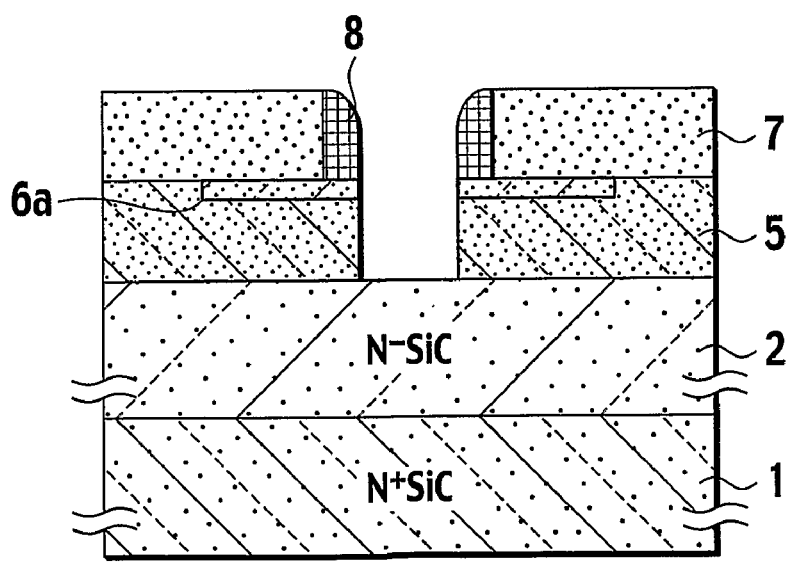

Next, referring to FIG. 23, using the hard mask 7 and side wall 8 as a mask, the P-type polycrystalline silicon layer 5 is etched.

Figure 24:
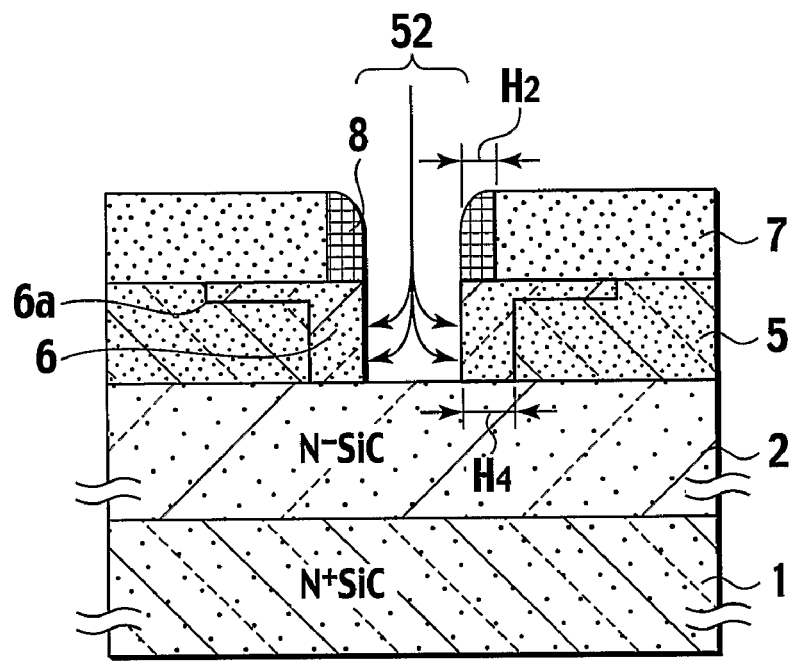

Next, referring to FIG. 24, the N-type impurity 52 is doped into a side face of the etched portion of the P-type polycrystalline silicon layer 5, whereby an N-type polycrystalline silicon layer 6 is formed. Impurity introduction methods include methods of isotropically doping an impurity, such as thermal impurity diffusion, plasma doping and gas doping, as well as tilt-angle ion implantation, and the like.

Figure 25:
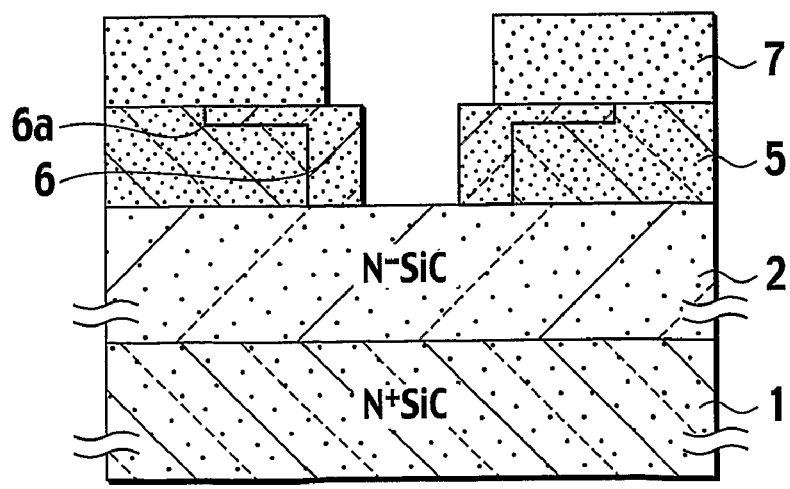

Next, referring to FIG. 25, the side wall 8 is removed by etching. In this event, since the side wall 8 and the hard mask 7 are formed of different materials, only the side wall 8 can be etched by highly selective wet etching.

Figure 26:
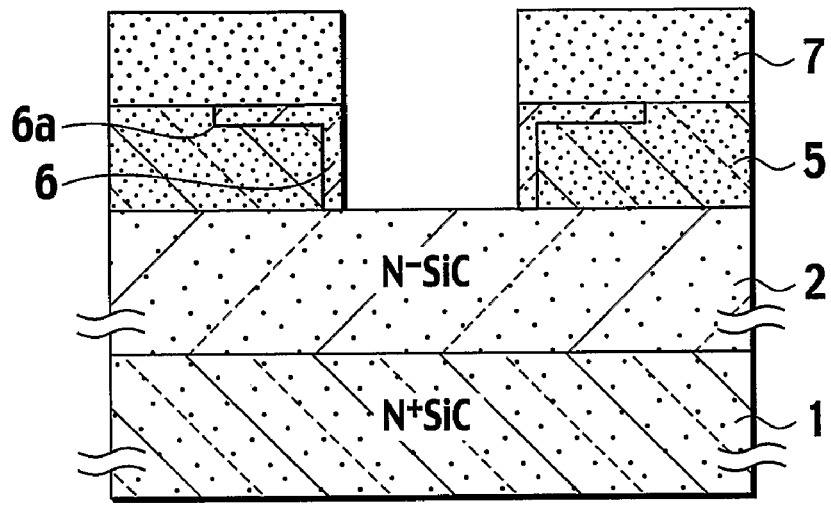
Figure 27:
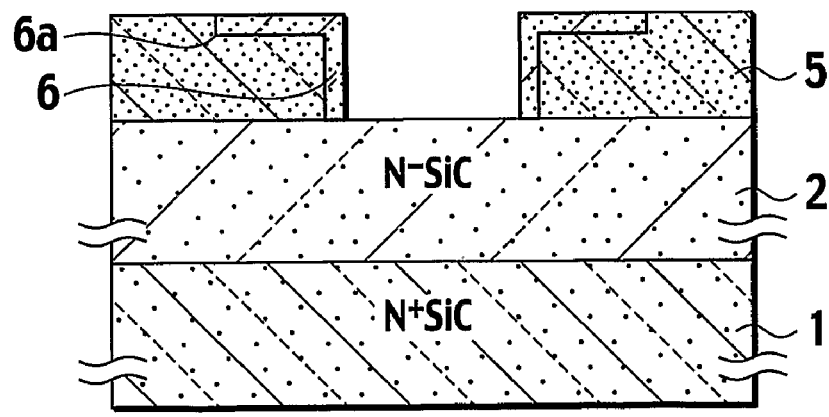

Next, referring to FIG. 26, further using the hard mask 7 as a mask, the N-type polycrystalline silicon layer 6 is etched. Next, referring to FIG. 27, the hard mask 7 is removed by etching. The subsequent process steps are similar to those shown in FIG. 13 to 15 in the first embodiment.

According to the present embodiment, the width H1 of the ultimately formed N-type polycrystalline silicon layer 6 is what is given by subtracting the width H2 of the side wall 8 from a width H4 of the N-type polycrystalline silicon layer 6 formed in the step shown in FIG. 24. Accordingly, even if the N-type impurity in the N-type polycrystalline silicon layer 6 is diffused widely, the N-type polycrystalline silicon layer 6 with a desired width can be formed in a self-aligning manner by controlling the width H2 of the side wall 8.

Moreover, the present embodiment has the advantage that the distribution of the N-type impurity in the depth direction is uniform because the N-type impurity is doped from the side face of the P-type polycrystalline silicon layer 5.

It should be noted that although the first to third embodiments employ the structure in which the N-type polycrystalline silicon layer 6 and the source electrode 12 are connected by the shallow N-type polycrystalline silicon layer 6a, it is not necessary to form the shallow N-type polycrystalline silicon layer 6a from end to end, that is, in the entire area in the front-rear direction of the drawing. The shallow N-type polycrystalline silicon layer 6a may be formed only in a partial area in the front-rear direction of the drawing.

Moreover, although the $N^+$-type silicon carbide substrate 1 and the $N^-$-type silicon carbide epitaxial layer 2 are used as a semiconductor body in the first to third embodiments, what is formed of any one of silicon carbide, gallium nitride and diamond may be used for a semiconductor body. Furthermore, although the P-type polycrystalline silicon layer 5 and the N-type polycrystalline silicon layer 6 are used as the first and second hetero semiconductor regions, respectively, in the first to third embodiments, what is formed of any one of single-crystal silicon, polycrystalline silicon, amorphous silicon, single-crystal silicon germanium, polycrystalline silicon germanium, and amorphous silicon germanium may be used for the first and second hetero semiconductor regions. In addition to these, what is formed of any one of single-crystal germanium, polycrystalline germanium, amorphous germanium, single-crystal gallium arsenide, polycrystalline gallium arsenide, and amorphous gallium arsenide may be used for the first and second hetero semiconductor regions.

The entire content of a Japanese Patent Application No. P2005-208798 with a filing date of Jul. 19, 2005 is herein incorporated by reference.

Although the invention has been described above by reference to certain embodiments of the invention, the invention is not limited to the embodiments described above and modifications may become apparent to these skilled in the art, in light of the teachings herein. The scope of the invention is defined with reference to the following claims.

INDUSTRIAL APPLICABILITY

According to the semiconductor device manufacturing methods of the present invention, by performing etching in a self-aligning manner on a polycrystalline silicon layer doped with an impurity, it is possible to controllably form the polycrystalline silicon layer with a width that is narrow enough to be able to suppress a leak current.

The invention claimed is:

1. A method of manufacturing a semiconductor device having a polycrystalline silicon layer, comprising:
    forming a mask layer on the polycrystalline silicon layer;
    forming a side wall that is provided on a side face of the mask layer and covers part of the polycrystalline silicon layer;
    doping an impurity into the polycrystalline silicon layer by using at least one of the mask layer and the side wall as a mask;
    etching the polycrystalline silicon layer by using at least one of the mask layer and the side wall as a mask, and after the doping, removing the mask layer and the side wall by etching.

2. A method of manufacturing the semiconductor device according to claim 1,
wherein after the mask layer is formed, the impurity is doped into the polycrystalline silicon layer by using the mask layer as the mask,
after the impurity is doped, the side wall is formed, and
after the side wall is formed, the impurity-doped polycrystalline silicon layer is etched by using the mask layer and the side wall as the mask.

3. A method of manufacturing the semiconductor device according to claim 1, further comprising:
diffusing the impurity in the polycrystalline silicon layer by thermal treatment; and
selectively etching the side wall,
wherein after the mask layer is formed, the side wall is formed,
after the side wall is formed, the impurity is doped into the polycrystalline silicon layer by using the mask layer and the side wall as the mask,
after the impurity is doped, the impurity is diffused,
after the impurity is diffused, the side wall is etched, and
after the side wall is etched, the impurity-doped polycrystalline silicon layer is etched by using the mask layer as the mask.

4. A method of manufacturing the semiconductor device according to claim 1, further comprising:
selectively etching the side wall,
wherein after the mask is formed, the side wall is formed,
after the side wall is formed, the polycrystalline silicon layer is etched by using the mask layer and the side wall as the mask,
after the polycrystalline silicon layer is etched, the impurity is doped into a side face of the polycrystalline silicon layer by using the mask layer and the side wall as the mask,
after the impurity is doped, the side wall is etched, and
after the side wall is etched, the impurity-doped polycrystalline silicon layer is etched.

5. A method of manufacturing a semiconductor device which includes: a semiconductor body; a first hetero semiconductor region that is formed of a semiconductor material having a band-gap width different from that of the semiconductor body and has a first conductivity type; a second hetero semiconductor region that is formed in a predetermined area of a surface of the semiconductor body, is formed of a semiconductor material having a band-gap width different from that of the semiconductor body, and has a second conductivity type; a gate electrode that is arranged to be adjacent, via a gate insulating film, to at least a second heterojunction interface, among a first heterojunction interface that is an interface between the semiconductor body and the first hetero semiconductor region, and the second heterojunction interface that is an interface between the semiconductor body and the second hetero semiconductor region; a source electrode connected to the first and second hetero semiconductor regions; and a drain electrode connected to the semiconductor body, the method comprising:
forming the first hetero semiconductor region doped with an impurity of the first conductivity type on the surface of the semiconductor body;
forming a mask layer on the first hetero semiconductor region; and
forming a side wall that is provided on a side face of the mask layer and covers part of the second hetero semiconductor region.

6. A method of manufacturing the semiconductor device according to claim 5, further comprising:
after forming the mask layer and before forming the side wall, doping an impurity of the second conductivity type into the first hetero semiconductor region by using the mask layer as a mask, thereby forming the second hetero semiconductor region; and
after forming the side wall, etching the second hetero semiconductor region by using the mask layer and the side wall as a mask.

7. A method of manufacturing the semiconductor device according to claim 5, further comprising:
doping an impurity of the second conductivity type into the first hetero semiconductor region by using the mask layer and the side wall as a mask, thereby forming the second hetero semiconductor region;
diffusing the impurity of the second conductivity type by thermal treatment;
selectively etching the side wall; and
etching the second hetero semiconductor region by using the mask layer as a mask.

8. A method of manufacturing the semiconductor device according to claim 5, further comprising:
etching the first hetero semiconductor region by using the mask layer and the side wall as a mask;
doping an impurity of the second conductivity type into a side face of the first hetero semiconductor region, thereby forming the second hetero semiconductor region;
selectively etching the side wall; and
etching the second hetero semiconductor region by using the mask layer as a mask.

9. A method of manufacturing the semiconductor device according to claim 5,
wherein the semiconductor body is formed of any one of silicon carbide, gallium nitride, and diamond.

10. A method of manufacturing the semiconductor device according to claim 5,
wherein each of the first and second hetero semiconductor regions is formed of any one of single-crystal silicon, polycrystalline silicon, amorphous silicon, single-crystal silicon germanium, polycrystalline silicon germanium, and amorphous silicon germanium.

11. A method of manufacturing the semiconductor device according to claim 5,
wherein each of the first and second hetero semiconductor regions is formed of any one of single-crystal germanium, polycrystalline germanium, amorphous germanium, single crystal gallium arsenide, polycrystalline gallium arsenide, and amorphous gallium arsenide.

12. A method of manufacturing the semiconductor device according to claim 5,
wherein the impurity of the first conductivity type is a P-type impurity.

* * * * *